(12) United States Patent
Shen et al.

(10) Patent No.: US 11,908,720 B2
(45) Date of Patent: Feb. 20, 2024

(54) CMP WAFER CLEANING EQUIPMENT, WAFER TRANSFER ROBOT AND WAFER FLIPPING METHOD

(71) Applicant: HANGZHOU SIZONE ELECTRONIC TECHNOLOGY INC., Zhejiang (CN)

(72) Inventors: Linghan Shen, Zhejiang (CN); EdwardLiCang Lee, Zhejiang (CN)

(73) Assignee: HANGZHOU SIZONE ELECTRONIC TECHNOLOGY INC., Zhejiang (CN)

( * ) Notice: Subject to any disclaimer, the term of this patent is extended or adjusted under 35 U.S.C. 154(b) by 424 days.

(21) Appl. No.: 17/283,958

(22) PCT Filed: Sep. 26, 2019

(86) PCT No.: PCT/CN2019/108020
§ 371 (c)(1),
(2) Date: Apr. 9, 2021

(87) PCT Pub. No.: WO2020/078190
PCT Pub. Date: Apr. 23, 2020

(65) Prior Publication Data
US 2021/0398834 A1 Dec. 23, 2021

(30) Foreign Application Priority Data

Oct. 15, 2018 (CN) .......................... 201821665696.X
Sep. 6, 2019 (CN) .......................... 201910842708.4

(51) Int. Cl.
*B24B 1/00* (2006.01)
*H01L 21/677* (2006.01)
(Continued)

(52) U.S. Cl.
CPC ........ *H01L 21/67718* (2013.01); *B08B 7/026* (2013.01); *B24B 37/27* (2013.01);
(Continued)

(58) Field of Classification Search
CPC .................................... B08B 3/02; B24B 1/00
(Continued)

(56) References Cited

U.S. PATENT DOCUMENTS

2002/0121290 A1* 9/2002 Tang .......................... B08B 1/04
134/28
2014/0213056 A1 7/2014 Lu et al.

FOREIGN PATENT DOCUMENTS

CN 201046544 4/2008
CN 105789096 7/2016
(Continued)

OTHER PUBLICATIONS

Office Action of Korea Counterpart Application, with English translation thereof, dated Nov. 25, 2022, pp. 1-8.
(Continued)

*Primary Examiner* — Gregory E Webb
(74) *Attorney, Agent, or Firm* — JCIP GLOBAL INC.

(57) ABSTRACT

Disclosed are a CMP wafer cleaning apparatus, and a wafer transfer manipulator and a wafer overturn method for same. The wafer transfer manipulator includes: a transverse transfer shaft, with same only being located at a side of a cleaning unit; a transverse transfer carriage provided on the transverse transfer shaft, and capable of transversely moving along the transverse transfer shaft; a first vertical lifting shaft provided on the transverse transfer carriage, and capable of vertically moving on the transverse transfer carriage; a rotary table provided on the first vertical lifting shaft; and a first claw clamping arm connected to the rotary table, and driven by the rotary table to move in a rotational manner.
(Continued)

The CMP wafer cleaning apparatus is provided, and when the CMP wafer cleaning apparatus fails, safe storage of a polished wafer can be realized.

17 Claims, 6 Drawing Sheets

(51) Int. Cl.
*B08B 7/02* (2006.01)
*B24B 37/27* (2012.01)
*B24B 37/34* (2012.01)
*H01L 21/68* (2006.01)
*H01L 21/687* (2006.01)

(52) U.S. Cl.
CPC ...... *B24B 37/345* (2013.01); *H01L 21/67706* (2013.01); *H01L 21/67712* (2013.01); *H01L 21/68* (2013.01); *H01L 21/68707* (2013.01); *H01L 21/68721* (2013.01); *H01L 21/68742* (2013.01); *H01L 21/68764* (2013.01); *H01L 21/68792* (2013.01)

(58) Field of Classification Search
USPC .............................................. 134/6; 510/175
See application file for complete search history.

(56) References Cited

FOREIGN PATENT DOCUMENTS

| | | | |
|---|---|---|---|
| CN | 108155126 | 6/2018 | |
| CN | 108198770 | 6/2018 | |
| CN | 208938938 | 6/2019 | |
| JP | H11307489 | 11/1999 | |
| JP | 2004515912 | 5/2004 | |
| KR | 20020032057 | 5/2002 | |
| KR | 20060124882 | 12/2006 | |
| KR | 20070007861 | 1/2007 | |
| WO | WO-0046842 A2 * | 8/2000 | ....... H01L 21/67046 |

OTHER PUBLICATIONS

"Written Opinion and Search Report of Singapore Counterpart Application", dated Apr. 22, 2022, p. 1-p. 11.

"International Search Report (Form PCT/ISA/210) of PCT/CN2019/108020", dated Dec. 27, 2019, with English translation thereof, pp. 1-5.

"Office Action of Korea Counterpart Application", dated Nov. 6, 2023, with English translation thereof, p. 1-p. 8.

* cited by examiner

FIG. 10

US 11,908,720 B2

CMP WAFER CLEANING EQUIPMENT, WAFER TRANSFER ROBOT AND WAFER FLIPPING METHOD

CROSS-REFERENCE TO RELATED APPLICATION

This application is a 371 of international application of PCT application serial no. PCT/CN2019/108020, filed on Sep. 26, 2019, which claims the priority benefit of China application no. 201821665696.X, filed on Oct. 15, 2018, and China application no. 201910842708.4, filed on Sep. 6, 2019. The entirety of each of the above mentioned patent applications is hereby incorporated by reference herein and made a part of this specification.

TECHNICAL FIELD

The invention relates to the field of equipment for manufacturing semiconductor integrated circuit chips, in particular to a CMP wafer cleaning equipment, a wafer transfer robot and a wafer flipping method thereof.

DESCRIPTION OF RELATED ART

With the rapid development of semiconductor industry, the critical dimension of integrated circuits continues to be miniaturized, and semiconductor wafers continue to develop toward small size, high circuit density, fast speed, and low power consumption. Integrated circuits have now entered the technological stage of ultra-large-scale integration (ULSI) of submicron size. Silicon wafers have the diameter gradually increased, accompanied by the radually narrowed scribed lines in the component and increased number of metal layers, therefore the high planarization of semiconductor film surface has a significant impact on the high performance, low cost, and high yield of devices. As a result, the flatness requirements on the surface of silicon wafers will become increasingly rigorous.

Currently, Chemical Mechanical Planarization (CMP), as the only leveling technology that can obtain a global planarization effect, has integrated technologies such as online measurement, online endpoint detection, cleaning, etc. As the product of integrated circuits toward miniaturization, multilayer, thinning, and planarization, CMP is also the technology necessary for the transition of wafers from 200 mm to 300 mm, or to larger diameters, and necessary for the improvement of productivity, the lowering of manufacturing costs, and the whole planarization of substrate.

After the wafer is processed by CMP, on the one hand, the objects removed and polishing liquid will remain on the wafer surface. In order to remove contaminants on wafer surface in time, the CMP equipment needs to be used together with cleaning equipment. Mainstream cleaning equipment is presently provided with vertical cleaning method and horizontal cleaning method, and each equipment is configured with different cleaning unit. Vertical cleaning unit can save equipment space, and present more consistent megasonic cleaning and scrubbing process. However, due to the influence of gravity during spin-drying, vertical cleaning unit has the drying effect inferior to the horizontal cleaning unit, while the latter is not conducive to timely removal of pollutants from wafer surface. It is therefore necessary to comprehensively consider the placement method of wafers based on the characteristics of cleaning unit and spin-drying unit, as well as the specific conversion of wafer placement mode. In addition, once the CMP wafer cleaning equipment fails, it is also necessary to consider how to safely store the wafers that have completed the polishing process without affecting the cleanliness of wafer surface.

On the other hand, one of the basic requirements in the process of wafer drying is to dry the wafers and prevent any particles originally attached to the solution from reattaching to the wafer. In order to achieve a better cleaning effect for the entire cleaning module, the drying unit can be placed horizontally, with other cleaning units placed vertically. In this configuration, in order to convert the wafer from a vertical state to a horizontal state, the wafer transfer robot has to support flipping to complete this work. In the existing cleaning robots, some of the claw clamping arms do not support rotation, and can only have a single degree of freedom of up and down movement at Z-axis, and flip wafers through the wafer claw. However, this method requires the movement of entire robot onto the top of drying equipment so that the claw clamping arm can put the wafers that have been flipped over by the wafer claws into the drying equipment. Since the wafer transfer robot is located in the placement process above the drying equipment, the cleanliness of wafer would be easily lowered due to the impurity particles introduced into the final drying process. Moreover, the wafer transfer robot has its transverse travel running through the entire cleaning module, and the long-travel transfer also has a certain impact on the transfer efficiency.

DISCLOSURE OF AN INVENTION

One of the objectives of the invention is to provide corresponding transfer methods for different configuration schemes of various cleaning units, and propose a safe storage solution for the wafers that have been polished when the CMP wafer cleaning equipment fails during cleaning, in order to effectively solve the problem of safe storage of wafers between procedure conversion.

The second objective of the invention is to provide a wafer transfer robot and its wafer flipping method to meet the process requirements of chemical mechanical planarization by realizing the conversion of the wafer in the horizontal and vertical states, and to exclude the possibility of impurity particles on the moving parts of the wafer transfer robot scattered on the wafer during drying process.

In order to achieve the first objective, the technical solution proposed by the invention is a CMP wafer cleaning equipment, comprising a cleaning input unit, a megasonic cleaning unit, a number of scrubbing units, and a spin-drying unit arranged in sequence, in addition, it also includes a transfer robot located above the cleaning equipment, comprising a horizontal movement axis, a vertical movement axis and a number of wafer grabbing devices, which can transport wafers between the units. The wafer grabbing device near the side of the spin-drying unit can grab and flip the wafers with independent wafer flipping function.

The above equipment also includes a polished wafer channel located between the cleaning input unit and the megasonic cleaning unit, so that the wafers before CMP process can conveniently pass through the cleaning equipment when entering the polishing area.

Both the polished wafer channel and the wafer bracket in the cleaning input unit can be moved out simultaneously or separately to facilitate wafer loading.

The above equipment also includes a buffer unit, which is located in front of the cleaning input unit and can temporarily store a number of wafers.

Preferably, 2-10 wafers can be temporarily stored in the buffer unit.

A water injector is installed in the buffer unit to prevent the wafers from being dried without being cleaned.

Preferably, the wafers are in the vertical direction during cleaning and brushing, and in the horizontal direction during spin-drying.

When the process requirements for vertical spin-drying can meet the processing requirements, the wafers are in the vertical direction during cleaning, brushing, and spin-drying.

In the direction from the cleaning input unit to the spin-drying unit, the transfer robot sequentially includes the first wafer grabbing device and the second wafer grabbing device.

In the condition of accepted cleaning capacity, the CMP wafer cleaning equipment also includes an independent flipping robot that is designed to eliminate the need for the wafer grabbing device close to the spin-drying unit to turn the wafers, and is used to grab and flip the wafers in the wafer grabbing device.

Compared with the prior art, the present invention has the following beneficial technical effects:

1. The buffer unit introduced in the invention enhances fault tolerance of the entire cleaning equipment. If, during wafer cleaning, the CMP wafer cleaning equipment fails, the polished wafers can be safely and effectively stored, and the problem of safe storage of wafers between procedure conversion is effectively addressed.

2. In order to utilize the equipment space more effectively, the CMP wafer cleaning equipment also includes a polished wafer channel located between the cleaning input unit and the megasonic cleaning unit, so that the wafers before CMP process can conveniently pass through the cleaning equipment when entering the polishing area.

3. According to different wafer cleaning process requirements, cleaning units can be all in vertical mode, or the spin-drying unit is switched to horizontal mode.

4. The transfer robot integrates two sets of grabbing devices on one set of horizontal motion axis, which improves the transfer efficiency and avoids the potential risk of mutual collision among multiple sets of horizontal axes designed.

In order to achieve the second objective above, the invention provides a wafer transfer robot used to transfer the wafers in the cleaning module of the chemical mechanical planarization equipment, to take out the wafers that have been cleaned in the cleaning unit in a vertical state, and to flip over and place them horizontally into the drying unit of the cleaning module, including:

A horizontal transfer shaft only located on one side of the cleaning unit;

A horizontal transfer carriage that is arranged on the horizontal transfer shaft and can move laterally along the horizontal transfer shaft;

The first vertical lifting shaft that is arranged on the lateral transfer pallet and can perform vertical movement on the lateral transfer carriage;

A rotating platform arranged on the first vertical lifting shaft;

The first jaw clamping arm which is connected to the rotating table and driven by the rotating platform to make rotational movement for wafer grabbing and placement.

For the above-mentioned wafer transfer robot, wherein the cleaning unit and drying unit is installed with switchable doors for automatic opening or closing when the wafer transfer robot grabs and places wafers.

For the above-mentioned wafer transfer robot, wherein the cleaning unit includes a pre-drying unit and other units of cleaning module, which are located on both sides of the pre-drying unit; the pre-drying unit works in vertical direction; the wafers in the pre-drying unit are transferred to the drying unit by the first jaw clamping arm; the other units of cleaning module may be one or more of the wafer transition unit, megasonic cleaning unit, and scrubbing unit.

For the above-mentioned wafer transfer robot, wherein the wafer transfer robot further includes: at least one second vertical lifting shaft, which is arranged on the lateral transfer carriage and can perform vertical movement on the lateral transfer carriage; the first vertical lifting shaft is located between the second vertical lifting shaft and the drying unit; each of the second vertical lifting shafts is also provided with a second claw clamping arm that can be used to transfer wafers from the other units of cleaning module to the pre-drying unit in combination with the first claw clamping arm.

The present invention also provides a wafer flipping method for a wafer transfer robot, wherein the method includes a wafer placement and robot returning;

The placement of wafer includes the following steps: after taking out the wafer from the pre-drying unit of cleaning unit, the first jaw clamping arm performs interactive or non-interactive actions in three movement directions: horizontal, vertical, and rotation, flips the wafer from the vertical state to the horizontal state, and places it in the drying unit;

Robot returning includes the following steps: after placing the wafer in the drying unit, the first jaw clamping arm restores from horizontal state to vertical state through interactive or non-interactive actions in three movement directions: horizontal, vertical, and rotation, and returns to the original position.

For the above-mentioned wafer flipping method by wafer transfer robot, the placement of wafer specifically includes the following steps:

After taking out the wafer from pre-drying unit, the first jaw clamping arm moves in the following three directions simultaneously: the horizontal transfer carriage drives the first jaw clamping arm to make transverse motion away from the drying unit; the rotating platform drives the first jaw clamping arm to rotate to the side close to the drying unit until the wafer reaches a horizontal state, and the first vertical lifting shaft drives the first jaw clamping arm to move vertically to a certain position;

Then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

For the above-mentioned wafer flipping method by wafer transfer robot, the placement of wafer specifically includes the following steps: After the first jaw clamping arm takes out the wafer from the pre-drying unit, the horizontal transfer carriage drives the first jaw clamping arm to make transverse motion away from the drying unit; the rotating platform drives the first jaw clamping arm to rotate to the side close to the drying unit until the wafer reaches a horizontal state, and the first vertical lifting shaft drives the first jaw clamping arm to move vertically to a certain position; then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

For the above-mentioned wafer flipping method by wafer transfer robot, the placement of wafer specifically includes the following steps: After the first jaw clamping arm takes out the wafer from the pre-drying unit, the horizontal transfer carriage drives the first jaw clamping arm to make transverse motion away from the drying unit; the rotating platform drives the first jaw clamping arm to rotate to the side close to the drying unit until the wafer reaches a horizontal state, and then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

For the above-mentioned wafer flipping method by wafer transfer robot, the placement of wafer specifically includes the following steps: after the first jaw clamping arm takes out the wafer from the pre-drying unit, the rotating platform drives the first jaw clamping arm to rotate to the side close to the drying unit until the wafer reaches a horizontal state, and then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

For the above-mentioned wafer flipping method by wafer transfer robot, Robot returning specifically includes the following steps: the first jaw clamping arm moves in the following three directions simultaneously when the wafer is positioned at drying unit: the horizontal transfer carriage drives the first jaw clamping arm to make transverse motion away from the drying unit; the rotating platform drives the first jaw clamping arm to rotate downward unit until the latter is in a vertical state, and the first vertical lifting shaft drives the first jaw clamping arm to move up vertically to a certain position;

For the above-mentioned wafer flipping method by wafer transfer robot, Robot returning specifically includes the following steps: when the wafer is positioned at drying unit, the first vertical lifting shaft drives the first jaw clamping arm to move up vertically to a certain position; the horizontal transfer carriage drives the first jaw clamping arm to make transverse motion to a certain position away from the drying unit; and then the rotating platform drives the first jaw clamping arm to rotate downward unit until the latter is in a vertical state;

For the above-mentioned wafer flipping method by wafer transfer robot, Robot returning specifically includes the following steps: when the wafer is positioned at drying unit, the horizontal transfer carriage drives the first jaw clamping arm to make transverse motion to a certain position away from the drying unit; the first vertical lifting shaft drives the first jaw clamping arm to move up vertically to a certain position; and then the rotating platform drives the first jaw clamping arm to rotate downward unit until the latter is in a vertical state;

Compared with the prior art, the present invention has the following beneficial effects:

1. The wafer transfer robot provided by the invention is arranged in the cleaning module of the chemical mechanical planarization equipment, which can effectively convert the wafer between horizontal state and vertical state and meet the actual production requirements. Robot flipping needs no additional space, nor will it interfere with other mechanisms, characterized by higher space utilization.

2. The wafer transfer robot in the invention enables the drying unit to select the wafer placement mode (vertical or horizontal) for the purpose of achieving the best effect, and the wafer placement mode of the drying unit is not required to be the same as that of the rest of the cleaning module to facilitate wafer transfer.

3. Since the lateral transfer shaft of the wafer transfer robot only moves to the pre-drying unit, a relatively rational travel, the lateral transfer carriage will not run to the side of the drying unit when the robot is placing a wafer in the drying unit after flipping, thereby excluding the possibility of impurity particles on the moving parts of the wafer transfer robot scattered on the wafer during drying process.

DESCRIPTION OF THE EMBODIMENTS

The present invention will be further described below through specific embodiments with reference to the accompanying drawings. These embodiments are only used to illustrate the present invention other than to limit its protection scope.

Figure 1:
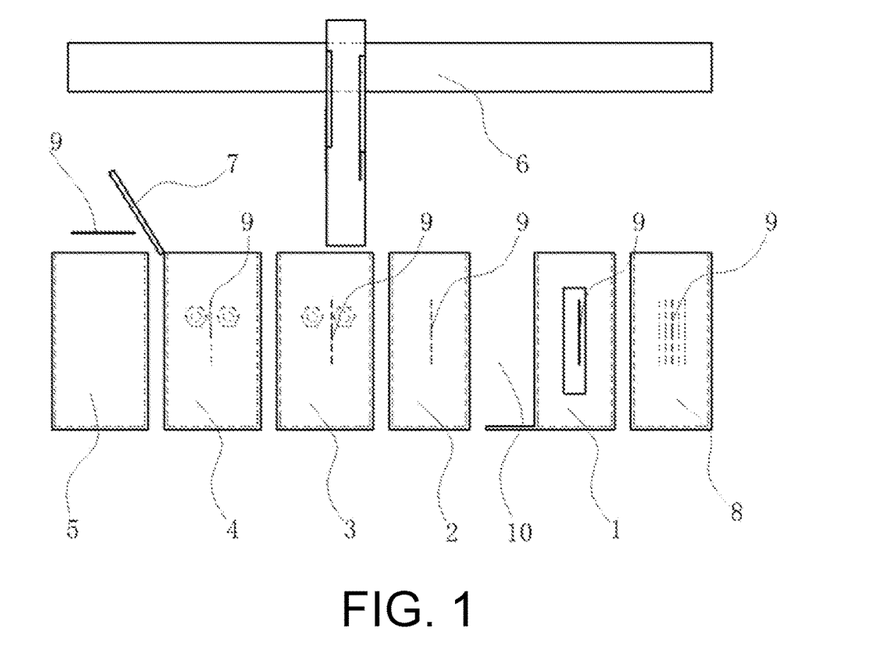
FIG. 1 is a structural diagram of the wafer cleaning equipment of the invention.
Figure 2:
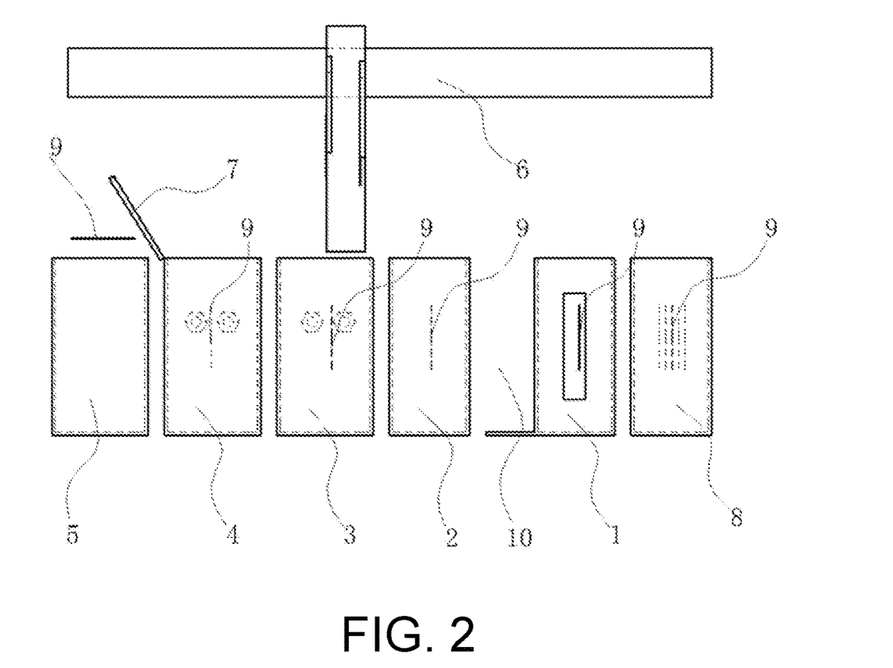
FIG. 2 is a three-dimensional effect diagram of the wafer cleaning equipment.

As shown in FIGS. 1 and 2, the wafer cleaning equipment for post-CMP cleaning provided by the invention includes a buffer unit 8, a cleaning input unit 1, a polished wafer channel 10, a megasonic cleaning unit 2, a scrubbing unit 3, a scrubbing unit 4, a spin-drying unit 5, transfer robot 6 and flipping robot 7.

In the CMP wafer cleaning equipment, buffer unit 8, cleaning input unit 1, polished wafer channel 10, megasonic cleaning unit 2, scrubbing unit 3, scrubbing unit 4, and spin-drying unit 5 are arranged in a row in sequence. A set of transfer robots 6 is arranged above the cleaning unit. The transfer robot 6 includes a horizontal movement axis 601, a vertical movement axis 602, the first wafer grabbing device 603 and the second wafer grabbing device 604.

In order to facilitate the pre-CMP wafer to easily pass through the cleaning unit when entering the polishing area, a polished wafer channel 10 is provided in the cleaning unit. The polished wafer needs to be cleaned immediately. The wafer to be cleaned 9 is first placed into the cleaning input unit 1, where a water spray device is designed to prevent the wafer 9 from becoming dry while waiting.

After the next cleaning unit, megasonic cleaning unit 2, finishes processing, the second wafer grabbing device 604 of transfer robot 6 grabs and cleans wafer 9 in the cleaning input unit 1 along the vertical movement axis 602, the first wafer grabbing device 603 and second wafer grabbing device 604 transfer wafers to the top of megasonic cleaning unit 2 along the horizontal movement axis 601; the first wafer grabbing device 603 picks up wafer 9 in the megasonic cleaning unit 2 along the vertical movement axis 602, and the second wafer grabbing device 604 places wafer 9 into the megasonic cleaning unit 2 along the vertical movement axis 602.

After the next cleaning unit, scrubbing unit 3, finishes processing, the first wafer grabbing device 603 and second wafer grabbing device 604 transfer wafers to the top of scrubbing unit 3 along the horizontal movement axis 601; the second wafer grabbing device 604 picks up wafer 9 in the scrubbing unit 3 along the vertical movement axis 602, and the first wafer grabbing device 603 places wafer 9 into the scrubbing unit 3 along the vertical movement axis 602.

After the next cleaning unit, scrubbing unit 4, finishes processing, the first wafer grabbing device 603 and second wafer grabbing device 604 transfer wafers to the top of scrubbing unit 4 along the horizontal movement axis 601; the first wafer grabbing device 603 picks up wafer 9 in the scrubbing unit 4 along the vertical movement axis 602, and the second wafer grabbing device 604 places wafer 9 into the scrubbing unit 4 along the vertical movement axis 602.

After the next cleaning unit, spin-drying unit 5, finishes processing, flipping robot 7 picks up wafer 9 in the grabbing device 603 and flips and places it in the spin-drying unit 5. After the wafer 9 is processed in the spin-drying unit 5, the entire cleaning process is completed, and wafer 9 is taken away by other robots. Wafer 9 is cleaned in this cycle.

When one or more of cleaning units fails, the wafer 9 in the cleaning input unit 1 will be placed in the buffer unit 8 by grabbing device 604. According to the capacity of the polishing equipment, the buffer unit can be designed to accommodate 2 to 10 wafers 9.

In addition, the CMP wafer cleaning equipment of the invention generally also integrates a CMP polishing equipment and an equipment front-end module (EFEM). A robot responsible for transferring wafers is arranged between CMP wafer cleaning equipment and CMP polishing equipment.

The wafer processed in the CMP polishing equipment is transferred by the robot to the cleaning input unit 1 of the invention. With the aid of transfer robot 6 and flipping robot 7, the wafer 9 sequentially passes through the megasonic cleaning unit 2 and the scrubbing unit 3, scrubbing unit 4 and spin-drying unit 5 through the entire cleaning process, and the robot in EFEM finally takes away the wafer 9 in the spin-drying unit 5.

The integrated CMP polishing equipment can simultaneously polish varying numbers (two or more) of wafers. In order to avoid the failure to safely store polished wafers due to the malfunction of CMP wafer cleaning equipment, a buffer unit 8 is designed in the cleaning equipment of the invention. Depending on the processing capacity of the integrated CMP polishing equipment, the buffer unit 8 can temporarily store 2 to 10 wafers, and it is also designed with a water spray device to prevent the wafers from being dried before cleaned.

Figure 3:
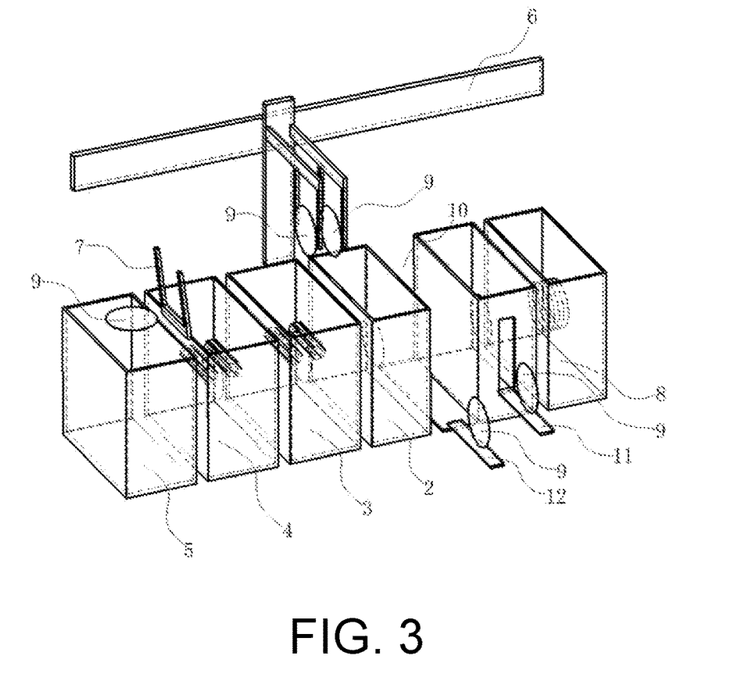
FIG. 3 is a three-dimensional effect diagram of the first embodiment of the invention.

As an embodiment, as shown in FIG. 3, the cleaning input unit 1 and polishing wafer channel 10 may be designed to be movable. When there are wafers in the CMP polishing equipment to be cleaned, the wafer bracket 11 in the cleaning input unit 1 moves out from the tank to load the wafers, and return to the cleaning input unit 1 after loaded with wafers. Similarly, the wafer to be polished is placed from EFEM unit on the wafer bracket 12 in the polished wafer channel 10, and wafer bracket 12 can move out a corresponding distance to facilitate the robot of CMP polishing equipment to fetch the wafer. The cleaning wafer bracket 11 and channel wafer bracket 12 may move simultaneously, or may be designed to move independently. This design shortens the travel distance of the robot in CMP polishing equipment and reduces the area occupied by the equipment.

Figure 4:
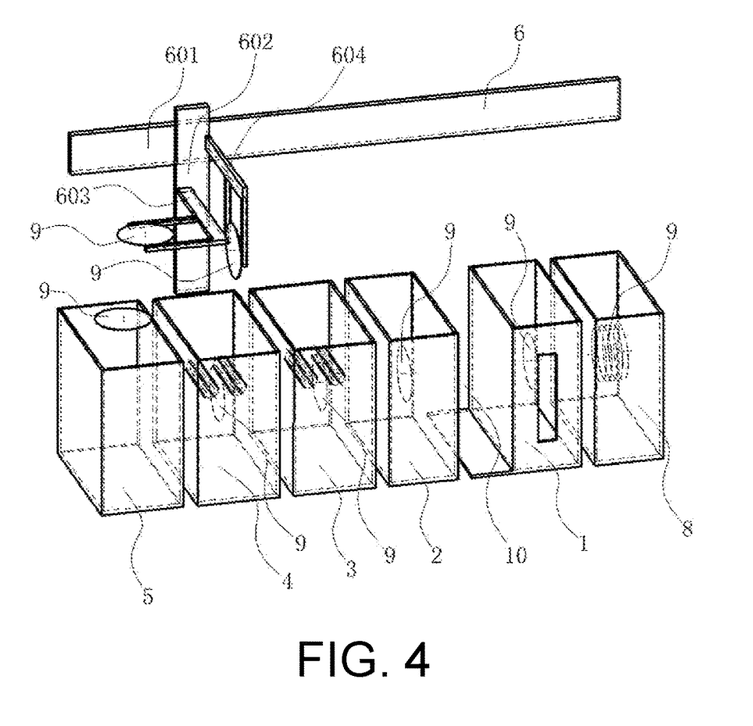
FIG. 4 is a three-dimensional effect diagram of the second embodiment of the invention.

As the second embodiment, as shown in FIG. 4, the wafer grabbing device 603 can be designed with wafer flipping function. This can eliminate a flipping robot, but will increase transfer time. This embodiment can be used if the cleaning capacity allows.

Figure 5:
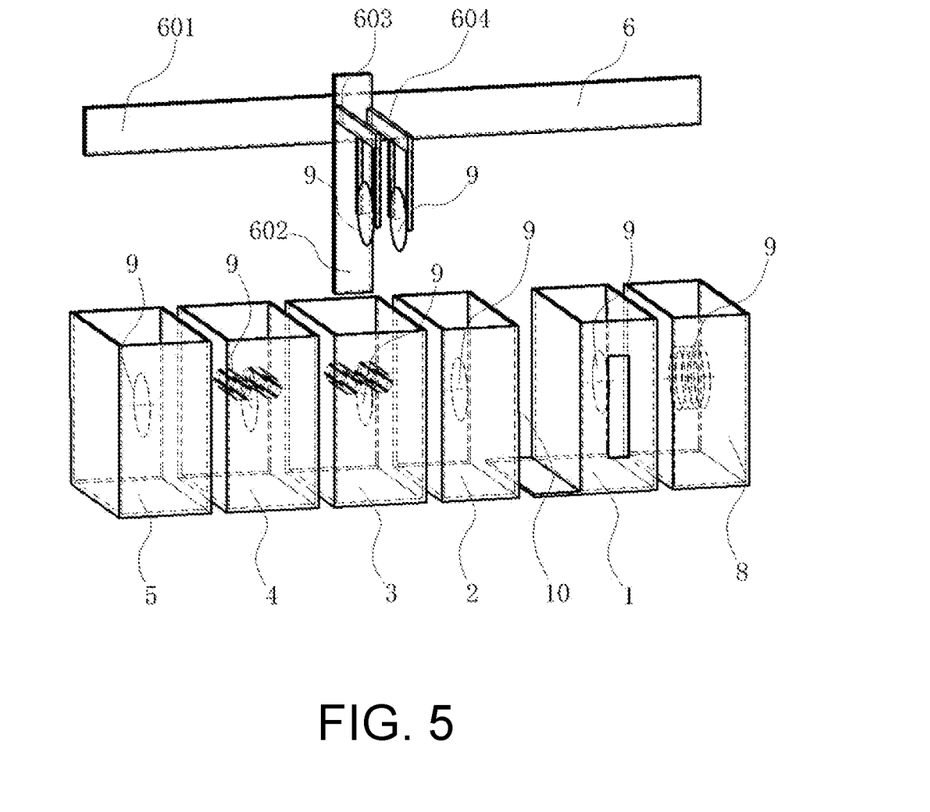
FIG. 5 is a three-dimensional effect diagram of the third embodiment of the invention.

As the third embodiment, as shown in FIG. 5, all the cleaning units are designed in a vertical manner, so that the wafer 9 is not flipped over when entering the spin-drying unit 5. The wafer transfer unit features simple mechanical structure and high transfer efficiency. This embodiment can be used when vertical spin drying meets the processing requirements.

Figure 6:
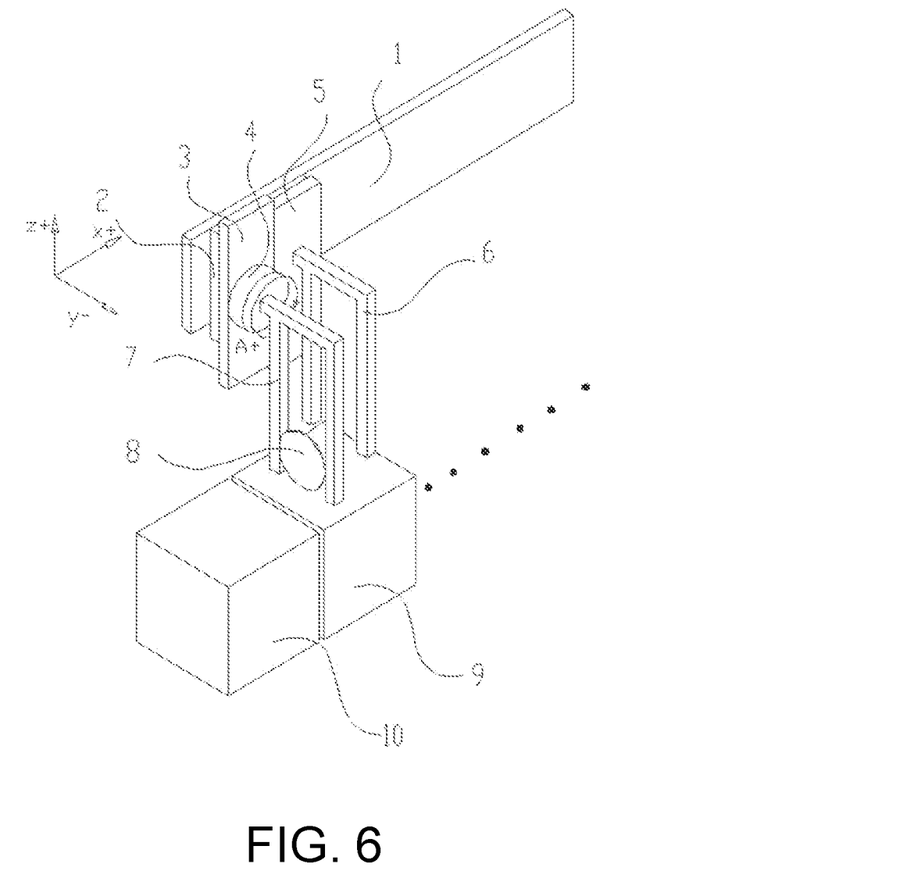
FIG. 6 is a schematic structural diagram of a preferred embodiment of the wafer transfer robot of the invention.

As shown in FIG. 6, the wafer transfer robot provided by the invention is used to transfer the wafer 9 in the cleaning module of the chemical mechanical planarization equipment, to take out the wafer 9 that have been cleaned in the cleaning unit in a vertical state, and to flip over and place it horizontally into the drying unit 21 of the cleaning module. In some preferred embodiments, the cleaning unit and the drying unit 21 are equipped with a switchable pneumatic door for automatically opening or closing wafer 9 when the wafer transfer robot grabs and places the wafer 9.

The cleaning unit of cleaning module includes: a pre-drying unit 20 and other units of the cleaning module; the drying unit 21 and other units of the cleaning module are located on both sides of the pre-drying unit 20; in some preferred embodiments, the pre-drying unit 20 may be a scrubbing unit in which the wafer 9 is operated in a vertical direction; other units of the cleaning module can be one or more of the wafer transition unit, megasonic cleaning unit, and scrubbing unit. The specific settings of the cleaning unit can be freely combined according to needs of actual production for flexible applications.

In this embodiment, the wafer transfer robot provided by the invention includes: a transverse transfer shaft 13, a transverse transfer carriage 14, the first vertical lift shaft 15, the second vertical lift shaft 17, and the first jaw clamping arm 19 and the second jaw clamping arm 18.

The lateral transfer carriage 14 is arranged on the lateral transfer shaft 13 and can move laterally along the lateral transfer shaft 13; the lateral transfer shaft 13 is only located on one side of the cleaning unit, so that the lateral transfer carriage 14 will not run to the side of the drying unit 21, thereby excluding the possibility of impurity particles on the moving parts of the wafer transfer robot scattered on the wafer 9 during drying process. It should be noted that the horizontal transfer shaft 13 only needs to be in a proper position so that the horizontal transfer carriage 14 does not run to the side of the drying unit, and there is no particular limitation for the spatial relative position of horizontal transfer shaft 13 and cleaning unit. The lateral transfer shaft 13 can be lower than the cleaning unit, as long as the wafer transfer robot can grab and place the wafer 9. More preferably, the transverse transfer shaft 13 is arranged above the cleaning unit for more optimal arrangement.

The first vertical lifting shaft 15 and the second vertical lifting shaft 17 arranged side by side on the lateral transfer carriage 14, can independently move vertically and upwardly on the lateral transfer carriage 14 respectively. The first vertical lifting shaft 15 is also provided with a rotating platform 16 to drive the rotation of the first claw clamping arm 19 connected to it. The rotating platform 16 is pneumatically or electrically driven. The second vertical lifting shaft 17 is directly connected to the second jaw clamping arm 18. The first jaw clamping arm 19 is closer to the drying unit 21 than the second jaw clamping arm 18, and is used to transfer wafer 9 from pre-drying unit 20 to drying unit 21.

The second jaw clamping arm 18 is used to transfer wafer 9 from other units of the cleaning module to the pre-drying unit 20. In this embodiment, the second jaw clamping arm 18 is provided for the purpose of higher production efficiency since the wafer 9 to be processed can enter the pre-drying unit 20 for processing immediately after the first jaw clamping arm 19 removes wafer 9 from pre-drying unit 20. However, in some embodiments, the arrangement of no second jaw clamping arm 18 does not affect the resolution of technical problems and the technical effect achieved by the invention. Therefore, the number of the second jaw clamping arms 18 is not limited in the invention, and can be determined according to the actual production.

The horizontal transfer shaft 13 is arranged on the side of the pre-drying unit 20, and the other units of cleaning module are placed under the horizontal transfer shaft 13 in the order shown in FIG. 6. The second jaw clamping arm 18 can be raised and lowered in the Z-axis direction through the second vertical lifting shaft 17, the first jaw clamping arm 19 can be rotated clockwise or counterclockwise through the rotary platform 16, and the rotary platform 16 can be raised and lowered in the Z-axis direction through the first vertical lifting shaft 15, and the horizontal transfer carriage 14 moves in the X-axis direction through the horizontal transfer shaft 13. Both the pre-drying unit 20 and other units of cleaning module are the front-end units for drying the wafer 9. The function of drying unit 21 is to dry and clean the surface of washed wafer 9, and the function of wafer transfer robot is to transport wafer 9 to each unit of the cleaning module through the lateral movement, vertical movement and rotational movement after clamping wafer 9.

The invention also provides a method of flipping wafer 9 by the above-mentioned wafer transfer robot. The method includes the steps of wafer placement 9 and Robot returning.

The placement of wafer 9 includes the following steps: after taking out the wafer 9 from the pre-drying unit of cleaning unit, the first jaw clamping arm 19 performs interactive or non-interactive actions in three movement directions: horizontal, vertical, and rotation, flips wafer 9 from vertical state to horizontal state, and places wafer 9 in the drying unit;

Robot returning includes the following steps: after placing the wafer 9 in the drying unit 21, the first jaw clamping arm 19 restores from horizontal state to vertical state through interactive or non-interactive actions in three movement directions: horizontal, vertical, and rotation, and returns to the original position.

The method provided by the invention of flipping wafer 9 based on the wafer transfer robot will be described in detail in the following seven embodiments. Of course, specific embodiments that can flip wafer 9 described in the invention are not limited to the following seven embodiments.

Embodiment 1

Figure 7:
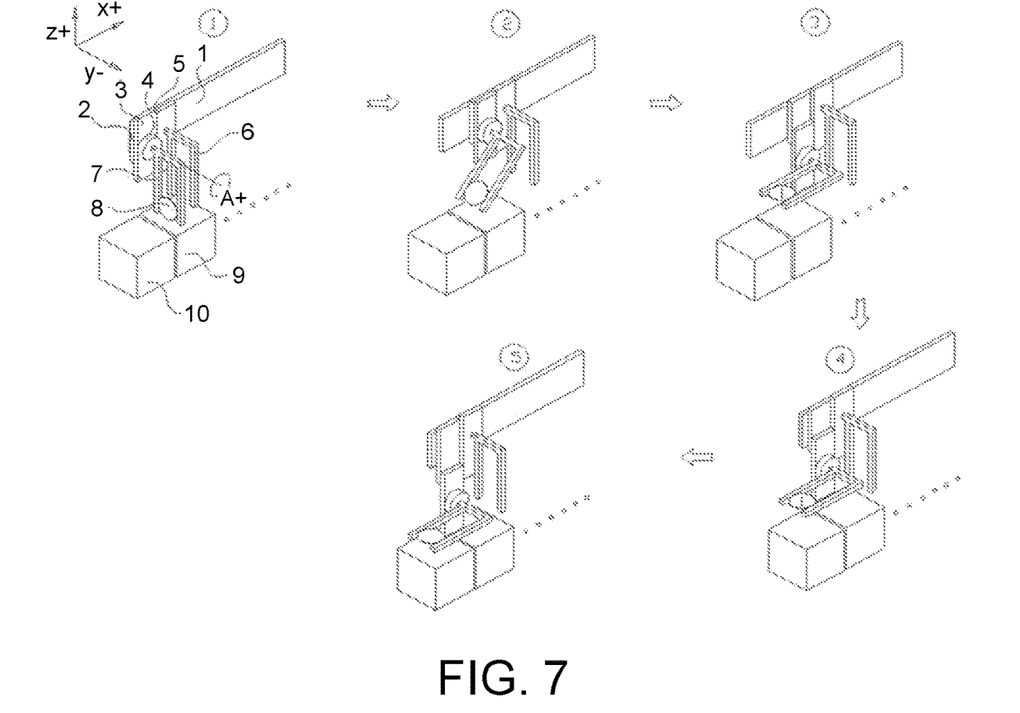
FIG. 7 is a schematic flowchart of Embodiment 1 of wafer placement in the wafer flipping method of the invention.

After the first jaw clamping arm 19 moves along the Z-axis direction to take out the wafer 9 from pre-drying unit 20 (as shown in part ① in FIG. 7), as shown in part ② in FIG. 7, the lateral transfer carriage 14 moves in the X+ direction, while the rotating platform 16 drives wafer 9 to rotate clockwise along A+, and the first vertical lifting shaft 15 carries the first jaw clamping arm 19 to move downward in the Z– direction. The first jaw clamping arm 19 moves in the three directions X+, A+, Z– with wafer 9, and coordinately completes the transition from vertical to horizontal. As shown in part ③ of FIG. 7, wafer 9 has reached the horizontal state. When the wafer 9 is being flipped, the designated mechanism inside drying unit 21 is ready to place the wafer 9. Subsequently, the lateral transfer carriage 14 drives the first jaw clamping arm 19 to move in the X-direction until wafer 9 is positioned above the drying unit 21 (as shown in part ④ in FIG. 7). The first jaw clamping arm 19 moves down in the Z-direction until wafer 9 is positioned in the designated mechanism inside the drying unit 21 (as shown in part ⑤ in FIG. 7), and the first jaw clamping arm 19 releases wafer 9 on the designated mechanism inside the drying unit 21.

Embodiment 2

Figure 8:
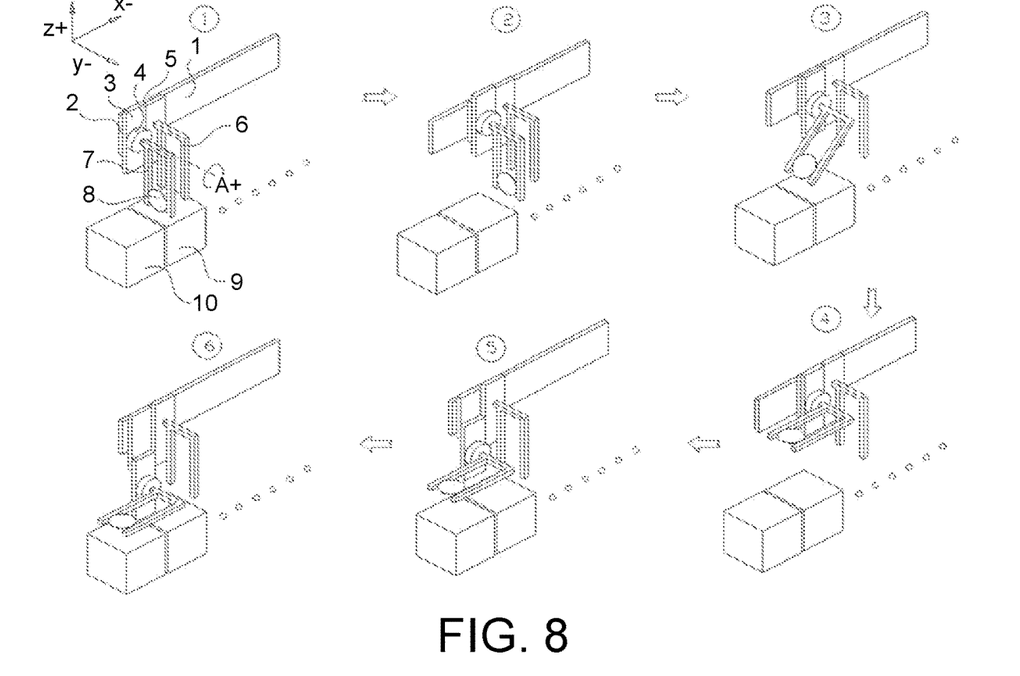
FIG. 8 is a schematic flowchart of Embodiment 2 of wafer placement in the wafer flipping method of the invention.

After the first jaw clamping arm 19 moves along the Z-axis direction to take out wafer 9 from pre-drying unit 20 (as shown in part ① of FIG. 8), as shown in part ② of FIG. 8, the lateral transfer carriage 14 moves a certain distance in the X+ direction, and then the rotating platform 16 drives the first jaw clamping arm 19 to rotate clockwise along A+ to a certain angle to make wafer 9 reach a horizontal state (as shown in parts ③ and ④ in FIG. 8). Then, the first vertical lifting shaft 15 moves downward to a certain position in the Z-direction with the first jaw clamping arm 19. When the wafer 9 is being flipped, the designated mechanism inside drying unit 21 is ready to place wafer 9. Subsequently, the lateral transfer carriage 14 drives the first jaw clamping arm 19 to move in the X-direction until wafer 9 is positioned above the drying unit 21 (as shown in part ⑤ in FIG. 8). The first jaw clamping arm 19 moves down in the Z-direction until wafer 9 is positioned in the designated mechanism inside the drying unit 21 (as shown in part ⑥ in FIG. 8), and the first jaw clamping arm 19 releases wafer 9 on the designated mechanism inside the drying unit 21. The above steps are the result of a combination of individual movements in each direction.

Embodiment 3

Figure 9:
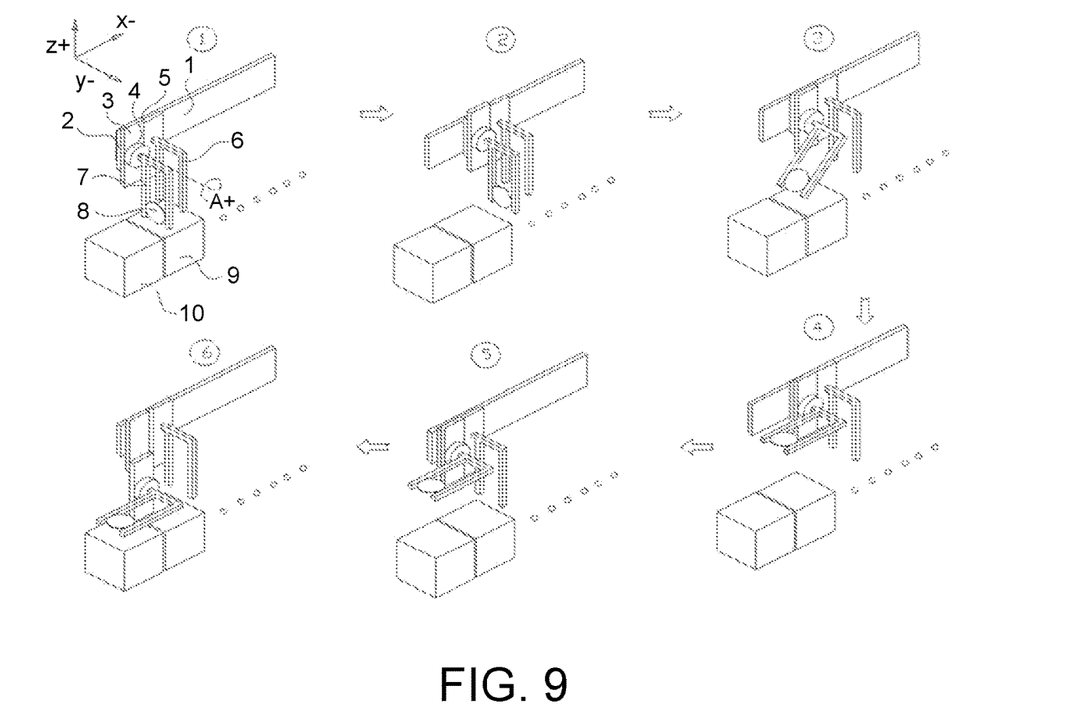
FIG. 9 is a schematic flowchart of Embodiment 3 of wafer placement in the wafer flipping method of the invention.

After the first jaw clamping arm 19 moves along the Z-axis direction to take out wafer 9 from pre-drying unit 20 (as shown in part ① of FIG. 9), as shown in part ② of FIG. 9, the lateral transfer carriage 14 moves a certain distance in the X+ direction, and the rotating platform 16 drives the first jaw clamping arm 19 to rotate clockwise along A+ to a certain angle to make the wafer 9 reach a horizontal state (as shown in part ③ and ④ of FIG. 9). Then the lateral transfer carriage 14 drives the first jaw clamping arm 19 to move in the X-direction (as shown in part ⑤ in FIG. 9), and the first vertical lifting shaft 15 moves downward to a certain position in the Z-direction with the first jaw clamping arm 19 until the wafer 9 is located in the designated mechanism inside the drying unit 21 (as shown in part ⑥ in FIG. 9). Finally, the first jaw clamping arm 19 releases wafer 9 on the designated mechanism inside the drying unit 21.

Embodiment 4

Figure 10:
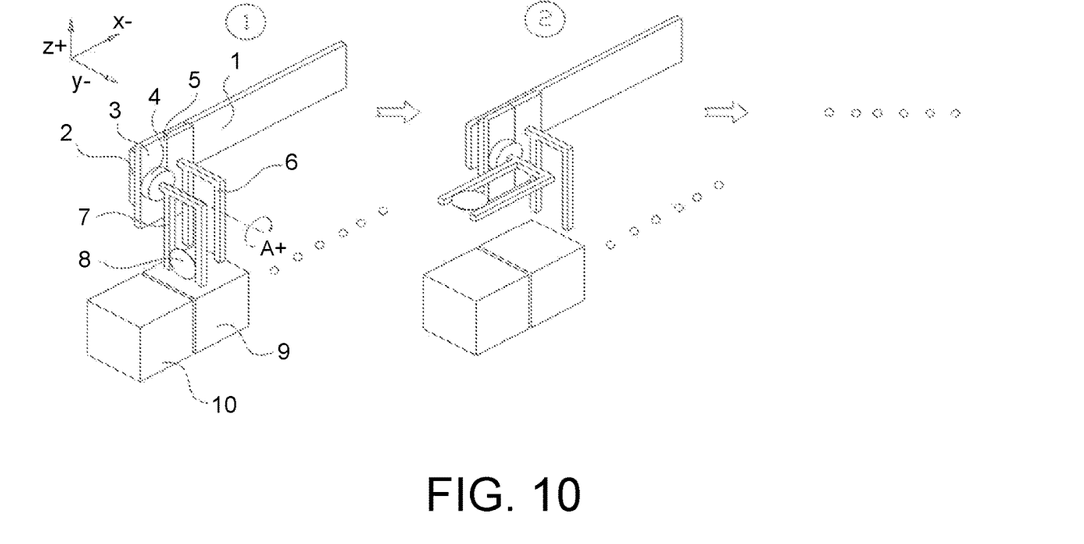
FIG. 10 is a schematic flowchart of Embodiment 4 of wafer placement in the wafer flipping method of the invention.

After the first jaw clamping arm 19 moves along the Z-axis direction to take out wafer 9 from pre-drying unit 20 (as shown in part ① in FIG. 10), the first jaw clamping arm 19 rotates clockwise along A+ to a certain angle to make wafer 9 reach a horizontal state (as shown in part ③ and ④ of FIG. 9), and according to the actual length of gripping arms of different jaws, move the lateral transfer carriage 14 in the X+ or X− direction (for fine adjustment), so that wafer 9 is directly above the drying unit 21. The first vertical lifting shaft 15 moves downward to a certain position in the Z-direction with the first jaw clamping arm 19 until the wafer 9 is located in the designated mechanism inside the drying unit 21. Finally, the first jaw clamping arm 19 releases wafer 9 on the designated mechanism inside the drying unit 21.

After wafer 9 is placed in the designated mechanism inside the drying unit 21, the robot will return to the original state, and the following embodiments 5-7 can be used to complete the entire cycle.

Embodiment 5

The action of placing wafer 9 can be performed by selecting any of the solutions in embodiments 1-4. After the wafer 9 is placed in the designated mechanism inside the drying unit 21, the robot will then return to the original state. The lateral transfer planer 14 will move in the X+ direction, and rotating platform 16 drives the wafer 9 to rotate clockwise along A−. The first vertical lifting shaft 15 rises in the Z+ direction with the first jaw clamping arm 19, so that the first jaw clamping arm 19 simultaneously moves at three directions: X+, A− and Z+, and completes the transition from horizontal to vertical.

Embodiment 6

The action of placing the wafer 9 can be performed by selecting any of the solutions in embodiments 1-4. When the wafer 9 is placed in the designated mechanism inside the drying unit 21, the robot will return to the original state, and the first jaw clamping arm 19 will first rise to a certain high position in the Z+ direction, and after moving a certain distance in the X+ direction, rotates in the A− direction until it returns to a vertical state, completing the entire cycle.

Embodiment 7

The action of placing the wafer 9 can be performed by selecting any of the solutions in embodiments 1-4. When the wafer 9 is placed in the designated mechanism inside the drying unit 21, the robot will return to the original state, and the first jaw clamping arm 19 will first rise to a certain high position in the X+ direction, and after moving a certain distance in the Z+ direction, rotates in the A− direction until it returns to a vertical state, completing the entire cycle.

In short, the placement of wafer 9 can be interactive or non-interactive, so does Robot returning. Embodiment 1-4 about the placement of wafer 9 and Embodiments 5-7 about Robot returning can be freely combined according to actual needs to adapt to the actual production environments.

In summary, the CMP wafer cleaning equipment provided by the present invention introduces a buffer unit. When the CMP wafer cleaning equipment fails, the polished wafer can be safely stored, and the problem of safe storage of wafers between procedure conversion is effectively addressed. The wafer transfer robot provided by the invention is arranged in the cleaning module of the chemical mechanical planarization equipment, which can effectively convert the wafer between the horizontal and vertical states and meet the actual production requirements. Robot flipping needs no additional space, nor will it interfere with other mechanisms, characterized by higher space utilization. The wafer transfer robot in the invention enables the drying unit to select the wafer placement mode (vertical or horizontal) for the purpose of achieving the best effect, and the wafer placement mode of the drying unit is not required to be the same as that of the rest of the cleaning module to facilitate wafer transfer. Since the lateral transfer shaft of the wafer transfer robot only moves to the pre-drying unit, a relatively rational travel, the lateral transfer carriage will not run to the side of the drying unit when the robot is placing a wafer in the drying unit after flipping, thereby excluding the possibility of impurity particles on the moving parts of the wafer transfer robot scattered on the wafer during drying process.

What is claimed is:

1. A chemical mechanical planarization (CMP) wafer cleaning equipment, comprising a cleaning input unit, a megasonic cleaning unit, a number of scrubbing units, and a spin-drying unit arranged in sequence, in addition, the megasonic cleaning unit further comprises a transfer robot located above the cleaning equipment, comprising a horizontal movement axis, a vertical movement axis and a number of wafer grabbing devices, which transports wafers between the units, the wafer grabbing device near the side of the spin-drying unit grabs and flips the wafers with own wafer flipping function,
   wherein the CMP wafer cleaning equipment further comprises a buffer unit, which is located in front of the cleaning input unit and temporarily stores a number of wafers,
   wherein a water injector is installed in the buffer unit to prevent the wafers from being dried without being cleaned.

2. The CMP wafer cleaning equipment of claim 1, wherein a polishing wafer channel is located between the cleaning input unit and the megasonic cleaning unit, so that the wafer to be subjected to chemical-mechanical polishing passes through the cleaning equipment when the wafer enters a polishing area.

3. The CMP wafer cleaning equipment of claim 2, wherein both the polished wafer channel and a wafer bracket in the cleaning input unit are moved out simultaneously or separately to facilitate wafer loading.

4. The CMP wafer cleaning equipment of claim 1, wherein the wafers are in the vertical direction during cleaning and brushing, and in the horizontal direction during spin-drying.

5. The CMP wafer cleaning equipment of claim 1, wherein the wafers are in the vertical direction during cleaning, brushing, and spin-drying.

6. The CMP wafer cleaning equipment of claim 1, wherein the transfer robot comprises the first wafer grabbing device and the second wafer grabbing device.

7. The CMP wafer cleaning equipment of claim 1, wherein the CMP wafer cleaning equipment further comprises an independent flipping robot that is designed to eliminate the need for the wafer grabbing device close to the spin-drying unit to turn the wafers.

8. A wafer transfer robot used to transfer wafers in a cleaning module of a chemical mechanical planarization equipment, to take out the wafers that have been cleaned in a cleaning unit in a vertical state, and to flip over and place them horizontally into a drying unit of the cleaning module, comprising:
  a horizontal transfer shaft only located on one side of the cleaning unit;
  a horizontal transfer carriage that is arranged on the horizontal transfer shaft and moves laterally along the horizontal transfer shaft;
  a first vertical lifting shaft that is arranged on a lateral transfer pallet and performs vertical movement on a lateral transfer carriage;
  a rotating platform arranged on the first vertical lifting shaft;
  a first jaw clamping arm which is connected to a rotating table and driven by the rotating platform to make rotational movement for wafer grabbing and placement,
  wherein the cleaning unit and drying unit is installed with switchable doors for automatic opening or closing when the wafer transfer robot grabs and places wafers,
  wherein the cleaning unit comprises a pre-drying unit and other units of cleaning module, which are located on both sides of the pre-drying unit; the pre-drying unit works in vertical direction; the wafers in the pre-drying unit are transferred to the drying unit by the first jaw clamping arm; the other units of cleaning module may be one or more of the wafer transition unit, megasonic cleaning unit, and scrubbing unit,
  wherein the cleaning module further comprises a buffer unit, which is located in front of the cleaning input unit and temporarily stores a number of wafers,
  wherein a water injector is installed in the buffer unit to prevent the wafers from being dried without being cleaned.

9. The wafer transfer robot of claim 8, wherein the wafer transfer robot further comprises: at least one second vertical lifting shaft, which is arranged on the lateral transfer carriage and preforms vertical movement on the lateral transfer carriage; the first vertical lifting shaft is located between the second vertical lifting shaft and the drying unit; each of the second vertical lifting shafts is also provided with a second claw clamping arm that is used to transfer wafers from the other units of cleaning module to the pre-drying unit in combination with the first claw clamping arm.

10. A wafer flipping method by wafer transfer robot of claim 8, wherein the method comprises a wafer placement and robot returning;
  the placement of wafer comprises the following steps: after taking out the wafer from the pre-drying unit of cleaning unit, the first jaw clamping arm performs interactive or non-interactive actions in three movement directions: horizontal, vertical, and rotation, flips the wafer from the vertical state to the horizontal state, and places it in the drying unit;
  the robot returning comprises the following steps: after placing the wafer in the drying unit, the first jaw clamping arm restores from horizontal state to vertical state through interactive or non-interactive actions in three movement directions: horizontal, vertical, and rotation, and returns to the original position.

11. The wafer flipping method by wafer transfer robot of claim 10, wherein the placement of wafer comprises the following steps:
  after taking out the wafer from pre-drying unit, the first jaw clamping arm moves in the following three directions simultaneously: the horizontal transfer carriage drives the first jaw clamping arm to make transverse motion in the direction away from the drying unit; the rotating platform drives the first jaw clamping arm to rotate to the side close to the drying unit until the wafer reaches a horizontal state, and the first vertical lifting shaft drives the first jaw clamping arm to move vertically to a certain position;
  then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

12. The wafer flipping method by wafer transfer robot of claim 10, wherein the placement of wafer comprises the following steps: after the first jaw clamping arm takes out the wafer from the pre-drying unit, the horizontal transfer carriage drives the first jaw clamping arm to make transverse motion away from the drying unit; the rotating platform drives the first jaw clamping arm to rotate to the side close to the drying unit until the wafer reaches a horizontal state, and the first vertical lifting shaft drives the first jaw clamping arm to move vertically to a certain position; then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

13. The wafer flipping method by wafer transfer robot of claim 10, wherein the placement of wafer comprises the following steps: after the first jaw clamping arm takes out the wafer from the pre-drying unit, the horizontal transfer carriage drives the first jaw clamping arm to make transverse motion away from the drying unit; the rotating platform drives the first jaw clamping arm to rotate to the side close to the drying unit until the wafer reaches a horizontal state, and then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

14. The wafer flipping method by wafer transfer robot of claim 10, wherein the placement of wafer comprises the following steps: after the first jaw clamping arm takes out the wafer from the pre-drying unit, the rotating platform drives the first jaw clamping arm to rotate to the side close to the drying unit until the wafer reaches a horizontal state, and then the horizontal transfer carriage drives the first jaw clamping arm to move laterally towards the drying unit until the wafer is positioned above drying unit; the first vertical lifting shaft drives the first jaw clamping arm to move vertically downwards until the wafer is positioned on the designated mechanism inside the drying unit; the first jaw clamping arm releases the wafer so that the wafer is positioned on the designated mechanism inside the drying unit.

15. The wafer flipping method by wafer transfer robot of claim 10, wherein the robot returning comprises the following steps: the first jaw clamping arm moves in the following three directions simultaneously when the wafer is positioned at drying unit: the horizontal transfer carriage drives the first jaw clamping arm to make transverse motion away from the drying unit; the rotating platform drives the first jaw clamping arm to rotate downward unit until the latter is in a vertical state, and the first vertical lifting shaft drives the first jaw clamping arm to move up vertically to a certain position.

16. The wafer flipping method by wafer transfer robot of claim 10, wherein the robot returning comprises the following steps: when the wafer is positioned at drying unit, the first vertical lifting shaft drives the first jaw clamping arm to move up vertically to a certain position; the horizontal transfer carriage drives the first jaw clamping arm to make transverse motion to a certain position away from the drying unit; and then the rotating platform drives the first jaw clamping arm to rotate downward unit until the latter is in a vertical state.

17. The wafer flipping method by wafer transfer robot of claim 10, wherein the robot returning comprises the following steps: when the wafer is positioned at drying unit, the horizontal transfer carriage drives the first jaw clamping arm to make transverse motion to a certain position away from the drying unit; the first vertical lifting shaft drives the first jaw clamping arm to move up vertically to a certain position; and then the rotating platform drives the first jaw clamping arm to rotate downward unit until the latter is in a vertical state.

* * * * *